US009685353B2

(12) United States Patent
Ganesan et al.

(10) Patent No.: US 9,685,353 B2
(45) Date of Patent: Jun. 20, 2017

(54) APPARATUS AND METHOD FOR EDGE BEVEL REMOVAL OF COPPER FROM SILICON WAFERS

(71) Applicant: Novellus Systems, Inc., Fremont, CA (US)

(72) Inventors: Kousik Ganesan, Tualatin, OR (US); Shantinath Ghongadi, Tilgard, OR (US); Tariq Majid, Wilsonville, OR (US); Aaron Labrie, Oregon City, OR (US); Steven T. Mayer, Aurora, OR (US)

(73) Assignee: Novellus Systems, Inc., Fremont, CA (US)

( * ) Notice: Subject to any disclaimer, the term of this patent is extended or adjusted under 35 U.S.C. 154(b) by 915 days.

(21) Appl. No.: 13/857,883

(22) Filed: Apr. 5, 2013

(65) Prior Publication Data
US 2014/0190529 A1 Jul. 10, 2014

Related U.S. Application Data

(62) Division of application No. 12/199,412, filed on Aug. 27, 2008, now Pat. No. 8,419,964.

(51) Int. Cl.
H01L 21/67 (2006.01)
H01L 21/02 (2006.01)
(Continued)

(52) U.S. Cl.
CPC ...... H01L 21/6708 (2013.01); H01L 21/0209 (2013.01); H01L 21/02068 (2013.01);
(Continued)

(58) Field of Classification Search
CPC .......... H01L 21/02087; H01L 21/0209; H01L 21/32134; H01L 21/6708; H01L 21/67745;
(Continued)

(56) References Cited

U.S. PATENT DOCUMENTS 4,313,266 A 2/1982 Tam
4,788,994 A 12/1988 Shinbara
(Continued)

FOREIGN PATENT DOCUMENTS

DE 4109955 10/1992
JP 04-135110 5/1992
(Continued)

OTHER PUBLICATIONS

US Office Action, dated Mar. 30, 2001, issued in U.S. Appl. No. 09/557,668.
(Continued)

Primary Examiner — Michael Barr
Assistant Examiner — Benjamin L Osterhout
(74) Attorney, Agent, or Firm — Weaver Austin Villeneuve & Sampson LLP

(57) ABSTRACT

Chemical etching methods and associated modules for performing the removal of metal from the edge bevel region of a semiconductor wafer are described. The methods and systems provide the thin layer of pre-rinsing liquid before applying etchant at the edge bevel region of the wafer. The etchant is less diluted and diffuses faster through a thinned layer of rinsing liquid. An edge bevel removal embodiment involving that is particularly effective at reducing process time, narrowing the metal taper and allowing for subsequent chemical mechanical polishing, is disclosed.

22 Claims, 9 Drawing Sheets

(51) Int. Cl.
*H01L 21/3213* (2006.01)
*H01L 21/677* (2006.01)
*H01L 21/687* (2006.01)

(52) U.S. Cl.
CPC .. *H01L 21/02087* (2013.01); *H01L 21/32134* (2013.01); *H01L 21/67745* (2013.01); *H01L 21/68735* (2013.01); *H01L 21/68785* (2013.01)

(58) Field of Classification Search
CPC ......... H01L 21/68735; H01L 21/68785; H01L 21/02068
See application file for complete search history.

(56) References Cited

U.S. PATENT DOCUMENTS

| | | | |
|---|---|---|---|
| 4,968,375 A | 11/1990 | Sato et al. | |
| 5,009,738 A | 4/1991 | Gruenwald et al. | |
| 5,376,216 A | 12/1994 | Yoshioka et al. | |
| 5,384,008 A | 1/1995 | Sinha et al. | |
| 5,486,234 A | 1/1996 | Contolini et al. | |
| 5,532,190 A | 7/1996 | Goodyear et al. | |
| 5,674,410 A | 10/1997 | Nakajima et al. | |
| 5,798,016 A | 8/1998 | Oehrlein et al. | |
| 5,810,940 A | 9/1998 | Fukazawa et al. | |
| 5,882,433 A | 3/1999 | Ueno | |
| 5,897,379 A | 4/1999 | Ulrich et al. | |
| 5,954,072 A | 9/1999 | Matusita | |
| 5,989,342 A | 11/1999 | Ikeda et al. | |
| 6,046,097 A | 4/2000 | Hsieh et al. | |
| 6,050,506 A | 4/2000 | Guo et al. | |
| 6,051,501 A | 4/2000 | Becker et al. | |
| 6,114,254 A | 9/2000 | Rolfson | |
| 6,162,739 A | 12/2000 | Sumnitsch et al. | |
| 6,167,893 B1 | 1/2001 | Taatjes et al. | |
| 6,217,034 B1 | 4/2001 | Smedt et al. | |
| 6,267,853 B1 | 7/2001 | Dordi et al. | |
| 6,273,484 B1 | 8/2001 | Peng | |
| 6,297,155 B1 | 10/2001 | Simpson et al. | |
| 6,306,245 B1 | 10/2001 | Yanagisawa et al. | |
| 6,309,981 B1 | 10/2001 | Mayer et al. | |
| 6,333,275 B1 | 12/2001 | Mayer et al. | |
| 6,363,623 B1 | 4/2002 | Abraham | |
| 6,413,436 B1 | 7/2002 | Aegerter et al. | |
| 6,506,689 B2 | 1/2003 | Rolfson | |
| 6,516,815 B1 | 2/2003 | Stevens et al. | |
| 6,520,839 B1 | 2/2003 | Gonzalez-Martin et al. | |
| 6,537,416 B1 | 3/2003 | Mayer et al. | |
| 6,578,853 B1 | 6/2003 | Treur et al. | |
| 6,586,342 B1 | 7/2003 | Mayer et al. | |
| 6,589,878 B1 | 7/2003 | Lorimer | |
| 6,758,908 B2 | 7/2004 | Whitman | |
| 6,817,640 B2 | 11/2004 | Menon et al. | |
| 6,838,355 B1 | 1/2005 | Stamper et al. | |
| 6,967,174 B1 | 11/2005 | Mayer et al. | |
| 7,029,567 B2 | 4/2006 | Basol | |
| 7,284,760 B2 | 10/2007 | Siebert et al. | |
| 7,399,713 B2 | 7/2008 | Aegerter et al. | |
| 7,780,867 B1 | 8/2010 | Mayer et al. | |
| 7,959,139 B2 | 6/2011 | Fukui et al. | |
| 8,100,081 B1 | 1/2012 | Henri et al. | |
| 8,172,646 B2 | 5/2012 | Feng et al. | |
| 8,419,964 B2 | 4/2013 | Ganesan et al. | |
| 2002/0160701 A1 | 10/2002 | Fehr et al. | |
| 2002/0179247 A1 | 12/2002 | Davis et al. | |
| 2003/0131494 A1* | 7/2003 | Lubomirsky | H01L 21/67028 34/317 |
| 2003/0196683 A1* | 10/2003 | Izumi | B08B 3/08 134/2 |
| 2004/0023475 A1 | 2/2004 | Bonser et al. | |
| 2004/0023502 A1 | 2/2004 | Tzou et al. | |
| 2004/0065540 A1 | 4/2004 | Mayer et al. | |
| 2004/0137745 A1 | 7/2004 | Houghton et al. | |
| 2004/0157471 A1 | 8/2004 | Davlin et al. | |
| 2005/0127361 A1 | 6/2005 | Hatano et al. | |
| 2006/0291854 A1* | 12/2006 | Kaneyama | G03D 7/00 396/604 |
| 2007/0068900 A1 | 3/2007 | Kim et al. | |
| 2007/0071439 A1* | 3/2007 | Kaneyama | G03F 7/70991 396/611 |
| 2007/0224826 A1 | 9/2007 | Delgadino et al. | |
| 2007/0232072 A1 | 10/2007 | Zheng et al. | |
| 2007/0273108 A1 | 11/2007 | Kitatsuru et al. | |
| 2010/0055924 A1 | 3/2010 | Ganesan et al. | |
| 2010/0219920 A1 | 9/2010 | Feng et al. | |

FOREIGN PATENT DOCUMENTS

| | | |
|---|---|---|
| JP | 04-186626 | 7/1992 |
| JP | 05-013322 | 1/1993 |
| JP | 05-326483 | 12/1993 |
| JP | 06-045302 | 2/1994 |
| JP | 09-171989 | 6/1997 |
| JP | 10-059540 | 3/1998 |
| JP | 2007-220868 A | 8/2007 |
| KR | 10-0131737 B1 | 4/1998 |
| KR | 10-2008-0080815 | 9/2008 |
| WO | 99-46064 | 9/1999 |

OTHER PUBLICATIONS

US Office Action, dated Jun. 19, 2002, issued in U.S. Appl. No. 09/558,249.
US Office Action, dated Dec. 16, 2004, issued in U.S. Appl. No. 10/357,999.
US Office Action, dated Jul. 6, 2006, issued in U.S. Appl. No. 11/248,874.
US Office Action, dated Aug. 23, 2007, issued in U.S. Appl. No. 11/248,874.
US Office Action, dated Nov. 28, 2007, issued in U.S. Appl. No. 11/248,874.
US Office Action, dated Jun. 4, 2008, issued in U.S. Appl. No. 11/248,874.
US Final Office Action, dated Nov. 30, 2009, issued in U.S. Appl. No. 11/248,874.
US Notice of Allowance, dated Jun. 4, 2010, issued in U.S. Appl. No. 11/248,874.
US Office Action, dated Jul. 20, 2012, issued in U.S. Appl. No. 12/834,788.
US Office Action, dated Dec. 2, 2008, issued in U.S. Appl. No. 11/479,353.
US Office Action, dated Jun. 1, 2009, issued in U.S. Appl. No. 11/479,353.
US Office Action, dated Dec. 7, 2009, issued in U.S. Appl. No. 11/479,353.
US Office Action, dated Sep. 15, 2011, issued in U.S. Appl. No. 12/701,387.
US Final Office Action, dated Feb. 23, 2012, issued in U.S. Appl. No. 12/701,387.
US Office Action, dated May 6, 2009, issued in U.S. Appl. No. 11/515,346.
US Final Office Action, dated Nov. 12, 2009, issued in U.S. Appl. No. 11/515,346.
US Final Office Action, dated Mar. 31, 2010, issued in U.S. Appl. No. 11/515,346.
US Office Action, dated Oct. 19, 2010, issued in U.S. Appl. No. 11/515,346.
US Final Office Action, dated Apr. 28, 2011, issued in U.S. Appl. No. 11/515,346.
US Notice of Allowance, dated Sep. 21, 2011, issued in U.S. Appl. No. 11/515,346.
US Office Action, mailed Jun. 24, 2010, issued in U.S. Appl. No. 11/737,045.
US Final Office Action, dated Dec. 9, 2010, issued in U.S. Appl. No. 11/737,045.
US Office Action, dated May 17, 2012, issued in U.S. Appl. No. 12/199,412.

(56) References Cited

OTHER PUBLICATIONS

US Notice of Allowance, dated Dec. 13, 2012, issued in U.S. Appl. No. 12/199,412.
US Office Action, dated Sep. 29, 2011, issued in U.S. Appl. No. 12/394,339.
US Notice of Allowance, dated Jan. 31, 2012, issued in U.S. Appl. No. 12/394,339.
Glen Research Center. "*Shape Effects on Drag*", National Aeronautics and Space Administration website http://www.grc.nasa.gov/WWW/K/airplane/shaped.html downlaoded Apr. 18, 2007.
Wolf, Stanley et al., "Silicon Processing for the VLSI Era, vol. 1: Process Technology", Lattice Press 91986, pp. 516-520.
Bird, R. Bryan et al., "Chapter 6: Interphase transport isothermal systems," John Wiley and Sons, 1960, pp. 180-1993.
U.S. Appl. No. 12/834,788, filed Jul. 12, 2010, entitled "Edge bevel removal of copper from silicon wafers".
U.S. Appl. No. 11/479,353, filed Jun. 30, 2006, entitled "Methods for removing deposits from the edge of a silicon substrate using plasma discharge".
U.S. Appl. No. 12/701,387, filed Feb. 5, 2010, entitled "Methods for removing deposits from the edge of a silicon substrate using a plasma discharge".
U.S. Appl. No. 11/737,045, filed Apr. 18, 2007, entitled "Wafer chuck with aerodynamic design for turbulence reduction".
US Notice of Allowance, dated May 24, 2005, issued in U.S. Appl. No. 10/357,999.
US Final Office Action, dated Feb. 4, 2013, issued in U.S. Appl. No. 12/834,788.
US Office Action, dated Aug. 27, 2001, issued in U.S. Appl. No. 09/557,695.
US Office Action, dated Feb. 28, 2014, issued in U.S. Appl. No. 11/737,045.
US Final Office Action, dated Jun. 4, 2014, issued in U.S. Appl. No. 11/737,045.
US Office Action, dated Nov. 6, 2014, issued in U.S. Appl. No. 11/737,045.
US Final Office Action, dated Feb. 17, 2015, issued in U.S. Appl. No. 11/737,045.
US Examiner's Answer to Appeal Brief dated Nov. 4, 2015 issued in U.S. Appl. No. 11/737,045.
Korean Office Action, dated Mar. 8, 2016, issued in Application No. KR 10-2010-0018330.
US Patent Board Decision on Appeal-Examiner Reversed dated Mar. 13, 2017 issued in U.S. Appl. No. 11/737,045.
US Notice of Allowance, dated Apr. 11, 2017, issued in U.S. Appl. No. 11/737,045.

\* cited by examiner

APPARATUS AND METHOD FOR EDGE BEVEL REMOVAL OF COPPER FROM SILICON WAFERS

CROSS-REFERENCE TO RELATED APPLICATIONS

This application is a divisional of, and claims priority to, U.S. patent application Ser. No. 12/199,412, filed Aug. 27, 2008, and entitled "APPARATUS AND METHOD FOR EDGE BEVEL REMOVAL OF COPPER FROM SILICON WAFERS." Both of the foregoing patent applications are related to U.S. patent application Ser. No. 11/248,874, naming Mayer et al. as inventors, and entitled "EDGE BEVEL REMOVAL OF COPPER FROM SILICON WAFERS." Each of the foregoing prior patent applications, as well as any other patent applications, patents, patent publications, or other publications referenced herein are hereby incorporated by reference in their entireties and for all purposes.

BACKGROUND OF THE INVENTION

This invention relates to technology for removing unwanted metal from semiconductor wafers. More particularly, it pertains to methods for removing unwanted metal, particularly metal in the edge bevel region, using liquid etchants. The invention also pertains to apparatus for performing such removal.

In a typical copper Damascene process, the formation of the desired conductive routes generally begins with a thin physical vapor deposition (PVD) of the metal, followed by a thicker electrofill layer (which is formed by electroplating). The PVD process is typically sputtering. In order to maximize the size of the wafer's useable area (sometimes referred to herein as the "active surface region") and, thereby, maximize the number of integrated circuits produced per wafer), the electrofilled metal must be deposited to very near the edge of the semiconductor wafer. Thus, it is necessary to allow physical vapor deposition of the metal over the entire front side of the wafer. As a byproduct of this process step, PVD metal typically coats the front edge area outside the active circuit region, as well as the side edge, and to some degree, the backside.

Electrofill of the metal is much easier to control, since the electroplating apparatus can be designed to exclude the electroplating solution from undesired areas such as the edge and backside of the wafer. One example of plating apparatus that constrains electroplating solution to the wafer active surface is the SABRE™ clamshell electroplating apparatus available from Novellus Systems, Inc. of San Jose, Calif. and described in U.S. Pat. No. 6,156,167 "CLAMSHELL APPARATUS FOR ELECTROCHEMICALLY TREATING SEMICONDUCTOR WAFERS," by E. Patton et al., and filed Nov. 13, 1997, which is herein incorporated by reference in its entirety.

The PVD metal remaining on the wafer edge after electrofill is undesirable for various reasons. For example, the PVD metal on the wafer edge is not suitable for subsequent depositions and tends to flake off generating undesirable particles. By contrast the PVD metal on the active interior region of the wafer is simply covered with thick and even electrofill metal and planarized by CMP down to the dielectric. This flat surface, which is mostly dielectric, is covered with a barrier layer, such as silicon nitride or silicon carbide, that both adheres well to the dielectric and aids in the adhesion of subsequent layers. Unfortunately, the barrier layer, which like the residual PVD metal layers deposits over the wafer edge area, is often thin and uneven and therefore may allow migration of the metal into the dielectric. This problem is especially important when the metal is copper.

To address these problems, semiconductor equipment may have to allow etching of the unwanted residual metal layers. Various difficulties will be encountered in designing a suitable etching system. For example, one of the main constraints of edge bevel removal (EBR) is a relatively long processing time. Smaller node technology allows significant reduction of plating time for thin films. In order to realize the throughput gain, it is highly desirable to reduce duration of all non-plating processes, such as EBR. Additional problems include controlling the etching area during the EBR process. It is desirable to minimize losses of electro-filled metal in the active area of the wafer while completely removing the surrounding bevel (i.e. to reduce "taper width" of the deposited metal). Overall, improved edge bevel removal methods and apparatuses are desired.

SUMMARY OF THE INVENTION

The present invention provides chemical etching methods and associated apparatus (including modules) for performing the removal of metal from the edge bevel region of a semiconductor wafer and also optionally the back side. In certain embodiments, the method includes rotating the wafer, prerinsing it with prerinse liquid, thinning a layer of the prerinse liquid formed on the surface of the wafer by increasing a rotational speed of the wafer, and delivering a stream of liquid etchant onto the edge of the wafer such that the liquid etchant selectively flows over the edge bevel. The liquid etchant substantially removes the unwanted metal selectively from the edge bevel area.

Typically, wafers are prerinsed with a solution to transform a dry or partially wetted edge and an edge-bevel to a uniformly wetted wafer edge. Without prerinsing, etchants tend to flow non-uniformly over the edge, by finding preferred paths that channel radially flowing fluid though sparse azimuthal wetted areas. Therefore, without creating a uniformly and completely wet edge, the quality of the edge bevel etching process can be compromised. However, after delivering of the prerinse liquid onto the surface of the wafer, it tends to accumulate at the wafer edge (bevel) due to a balance in centrifugal forces driving fluid radially outward and surface tension forces tending to hold the prerinsing liquid to the wafer.

During and after delivering of a prerinsing liquid on the surface of the wafer, the liquid is being displaced from the surface by centrifugal forces. Some liquid is eventually spun off at the wafer edge, however, the rest of the liquid remains on the surface and accumulates at the edge forming an edge bead fluid. The bead is a thicker liquid layer and is positioned at the exact location where concise rapid etching is desired and causes significant process impediments. It is desirable to remove or at least to thin the bead of the fluid to promote diffusion and enhance etching rates. The proposed methods of thinning the prerinsing liquid include high speed rotation of wafer to increase centrifugal forces and facilitate displacement of prerinse fluid, addition of thinning fluids, aerosol or gasses that may enhance evaporation and reduce surface tension, and heating the prerinse liquid.

In one embodiment, the method of removing metal from the bevel edge area includes prerinsing of rotating wafer using a prerinse liquid that may be, for example, deionized water. The wafer is then rotated at higher speed to increase centrifugal force acting and displace some pre-rinse liquid from the surface of the wafer. The bead of the prerinse liquid at the edge of wafer may be substantially thinned when the wafer rotates at a higher speed. Thereafter, a stream of liquid etchant is delivered onto the edge of the wafer, such that the etchant selectively flows over the edge bevel area. The etchant passes through the layer of the remaining prerinse liquid and etches away the unwanted metal on the bevel edge area. A thinned layer of the prerinse liquid allows for faster and more precise diffusion of the etchant through the layer.

In one embodiment, a thinning operation may be performed at the rotational speed of at least about 600 rpm. In another embodiment, the speed of the wafer during the thinning operation may be increased to at least about 900 rpm. Higher rotational speeds and/or longer operation times allow more prerinse liquid to be removed from the surface of the wafer and to achieve a much thinner edge bead. The fluid edge bead thinning operation can also include delivering a stream of thinning liquid, such as a liquid stream of isopropyl alcohol, acetone or water with dissolved surfactants. In another embodiment, a vapor or aerosol stream of a thinning a thinning agent is delivered to the edge of the wafer. This facilitates removal of prerinse liquid with reduced spotting on the substrate.

The thinning operation may also provide a relatively uniform prerinse liquid distribution on the surface of the wafer and allow a shorter the etching operation, such as less than 30 seconds and even less than 25 seconds. In one embodiment of this invention, the prerinse operation continues for less than about 10 seconds, more preferably less than 5 seconds. It is also possible to reduce the duration of the prerinse operation to less than about 5 seconds. The pre-rinse operation is then followed by a wet thin film thinning operation.

Implementation of a thinning operation may reduce the taper width to less than about 200 micrometers. In one embodiment, a taper width may be less than about 100 micrometers. In yet another embodiment, the taper may be reduced to less than about 50 micrometers. Moreover, thinning the layer of the prerinse liquid may allow for faster etching. In one embodiment, delivering a stream of the liquid etchant onto the edge of the rotating wafer continues for less than about 30 seconds. In another embodiment, the operation takes less than about 25 seconds.

In the edge bevel etching operation the stream of etchant selectively flows over the edge bevel. In one embodiment of the invention, the etchant may comprise sulfuric acid, $H_2SO_4$. The sulfuric acid concentration in the etchant may be at least about 15% by weight.

In certain embodiments, the etching operation may also be performed in two or more separate sub-operations, each with different flow rates of etchant. In one embodiment, the flow rate of the first sub-operation is substantially higher than the flow rate of the subsequent sub-operations.

The EBR method may also involve using a deflector shield to divert the prerinse liquid further into the area under the wafer. In one embodiment, the method also includes the operation of rinsing at least some of the liquid etchant from the wafer using a rinse liquid comprising deionized water. This rinsing operation may be performed at the rotational speed of at least 600 rpm. In one specific embodiment, the rinsing operation is performed at the rotational speed of at least 1000 rpm.

In another embodiment, the method of removing metal from edge bevel area includes prerinsing the rotating wafer with prerinse liquid comprising deionized water. Then the prerinse liquid layer is thinned by delivering a stream of a thinning liquid over the edge bevel. The thining liquid may change the properties of the pre-rinse liquid, such as reducing its surface tension and/or viscosity, increasing temperature and/or vapor pressure, and others. Thereafter, a stream of liquid etchant is delivered onto the edge of the wafer, such that the etchant selectively flows over the edge bevel area. The etchant passes through the layer of the remaining prerinse liquid and etches away the unwanted metal on the bevel edge area.

Alternatively, the prerinse liquid may be thinned by delivering a stream of a vapor or aerosol of a thinning agent over the edge bevel. The thinning agent may likewise change the properties of the remaining prerinse liquid layer to enhance its thinning. Yet, in another embodiment, the prerinse liquid may be thinned by heating the layer of prerinse liquid over the edge bevel. Heating may be performed by delivering a thinning agent or liquid having higher temperature than the pre-rinse liquid, radiation heating, or any other means. Thereafter, a stream of liquid etchant is delivered onto the edge of the wafer, such that the etchant selectively flows over the edge bevel area.

In certain embodiments, an apparatus is provided for removing unwanted metal deposited on an edge bevel area of a semiconductor wafer. Such apparatus may include a process chamber, a wafer chuck for supporting and rotating the wafer during removal of the edge bevel area, and a controller including program instructions for prerinsing the wafer using a prerinse liquid, thinning a layer of the prerinse liquid by increasing the rotation speed of the wafer, and delivering a stream of liquid etchant onto the edge of the rotating wafer. In one embodiment, the apparatus includes a deflector shield positioned around the wafer chuck and configured to divert the prerinse liquid to a bottom of process chamber. In one specific embodiment, the deflector shield is attached to the bottom of the process chamber. In another specific embodiment, the deflector shield is attached to the wafer chuck and rotates together with the wafer chuck.

These and other features and advantages will be described in further detail below with reference to the drawings.

DETAILED DESCRIPTION OF THE PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

As indicated, this invention pertains to removal of unwanted material from an edge bevel region of a semiconductor wafer. A "semiconductor wafer" as referred to in this invention is a semiconductor substrate at any of the various states of manufacture in the production of integrated circuits. One standard semiconductor wafer described in this invention is 300 mm in diameter, 0.75 mm in thickness, with an approximate radius of curvature of about 0.15 millimeters (see SEMI Specification M1.15-0997). Of course, semiconductor wafers of other dimensions, such as a standard 200 mm diameter silicon wafers, can also be processed in accordance with this invention (see SEMI Specification M1-0298). Many process parameters disclosed herein are dependent on wafer size. For example, rotational speeds are specified for 300 mm and are inverse proportional to other diameters. Therefore, rotational speed of 400 rpm for a 300 mm wafer will be generally equivalent to 600 rpm for a 200 mm wafer.

Figure 1A:
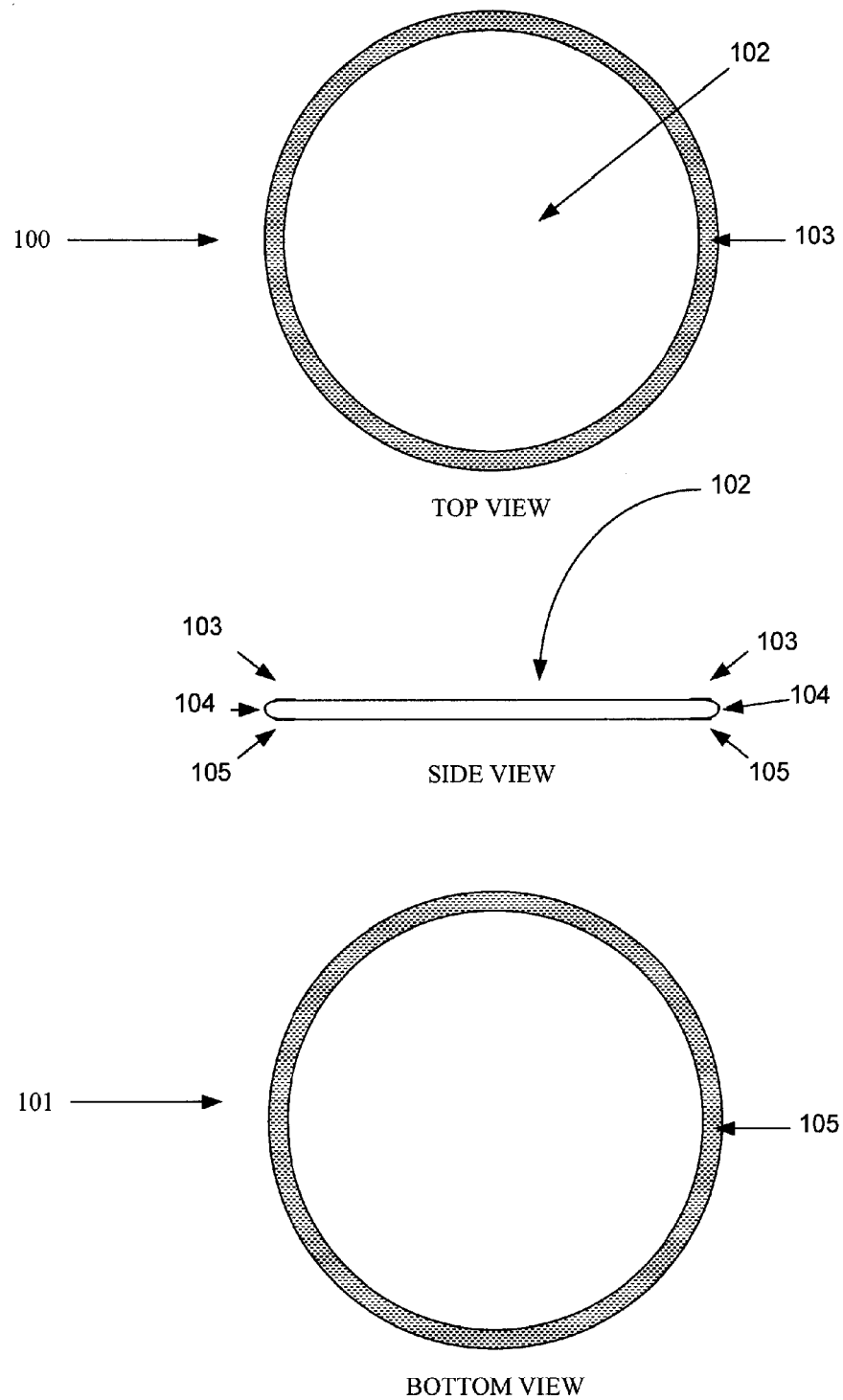
FIG. 1A is an illustration of a semiconductor wafer showing the location of the edge bevel region that is etched in accordance with this invention.

To facilitate understanding of this invention, a schematic illustration of a semiconductor wafer is shown in FIG. 1A. As shown, the wafer has a top or "front" side 100 and a "backside" 101. The wafer also has an interior "active circuit region" 102 on the front side 100 where integrated circuit devices with associated conductive metal routes are formed. To maximize use of expensive semiconductor material, this active circuit region 102 should constitute a high fraction of the area on the front side 100 of the wafer. As shown, the wafer also includes a "front edge" area 103, which is the region on the front of the wafer that lies outside the active circuit region, a "side edge" area 104 (sometimes referred to herein as an "edge bevel region") and a "back edge" area 105. The side edge 104 lies in the area between the front side 100 and the backside 101, and the back edge 105 is roughly the area near the outer boundary of the wafer on its backside, approximately analogous to the front edge area 103. Some unwanted metal such as copper may deposit on regions 103, 104, and 105. Some metal may also deposit over the entire backside 101. One use of the present invention is to remove unwanted metal from these regions without substantially affecting metal deposited on the active circuit region 102.

Figure 1B:
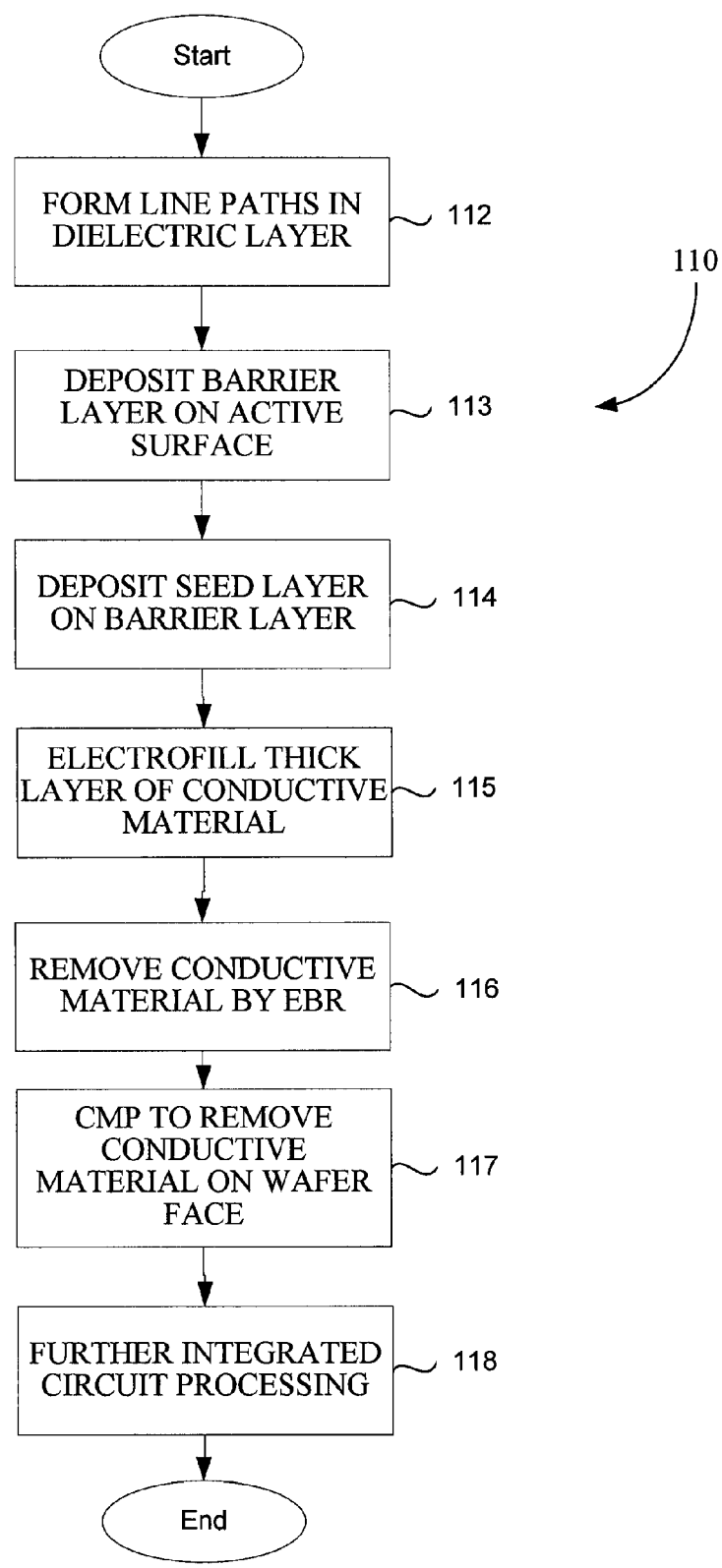
FIG. 1B is a process flow diagram illustrating relevant operations employed to form conductive copper lines a Damascene process in the context of this invention.

A brief description of a typical Damascene process is provided to facilitate understanding the context of the present invention. A typical process flow 110 is presented in the flowchart of FIG. 1B. Process 110 begins with formation of line paths 112 in a previously formed dielectric layer, which may be etched with trenches and vias. The lines define conductive routes between various devices on a semiconductor wafer to be filed with conductive materials. The process continues with depositing a thin diffusion barrier layer 113 to prevent diffusion of the conductive materials into the dielectric layer. Suitable materials for the diffusion barrier layer include tantalum, tantalum nitride, tungsten, titanium, and titanium tungsten. In a typical embodiment, the barrier layer is formed by a PVD process such as sputtering. The next following operation involves depositing a conductive seed layer 114 to provide a uniform conductive surface for current passage during an electrofill operation 115. A PVD method may be employed for this operation. The wafer is then electrofilled at operation 115 with a thicker layer of copper over the seed layer. Electrofilling continues until the line paths completely filled to the top surface of the dielectric.

It is desirable to use as much of the wafer surface for active circuitry as possible. While it is generally possible to provide some shielding during electroplating, similar shielding is not as straightforward for PVD. Therefore, during the PVD seed layer formation copper is deposited in some unwanted areas, such as bevel edge region. Thick copper deposition may result in higher currents in this area during the electrofill adding even more metal into the undesirable areas forming a bevel-like shape on the edge of the wafer. This bevel may easily break away during later CMP and damage devices on the surface of the wafer. As a result, the bevel must be removed, which is accomplished by the EBR and/or backside etch (BSE) processes of the present invention.

With EBR at operation 116, etchant is applied to the front edge of the wafer in a thin stream. In certain embodiments, the etchant is applied under viscous flow conditions to remain thin over the thinned layer of the pre-rinse liquid. The etchant is generally applied with some radial velocity corresponding to the flow rate and nozzle orientation. Additionally, the etchant is forced to the edge of the wafer by the centrifugal force resulting from the rotation of the wafer. The combination of these two forces with gravitational force and surface tension, causes the etchant to flow outward, and down over the side edge and onto a few millimeters onto the backside, thus accomplishing removal of the unwanted metal from all three of these areas. After EBR, the electroplated copper is planarized, generally by CMP down to the dielectric in preparation for further processing (illustrated at block 118), generally the addition of subsequent dielectric and metalization layers.

Electrofill System

Figure 2A:
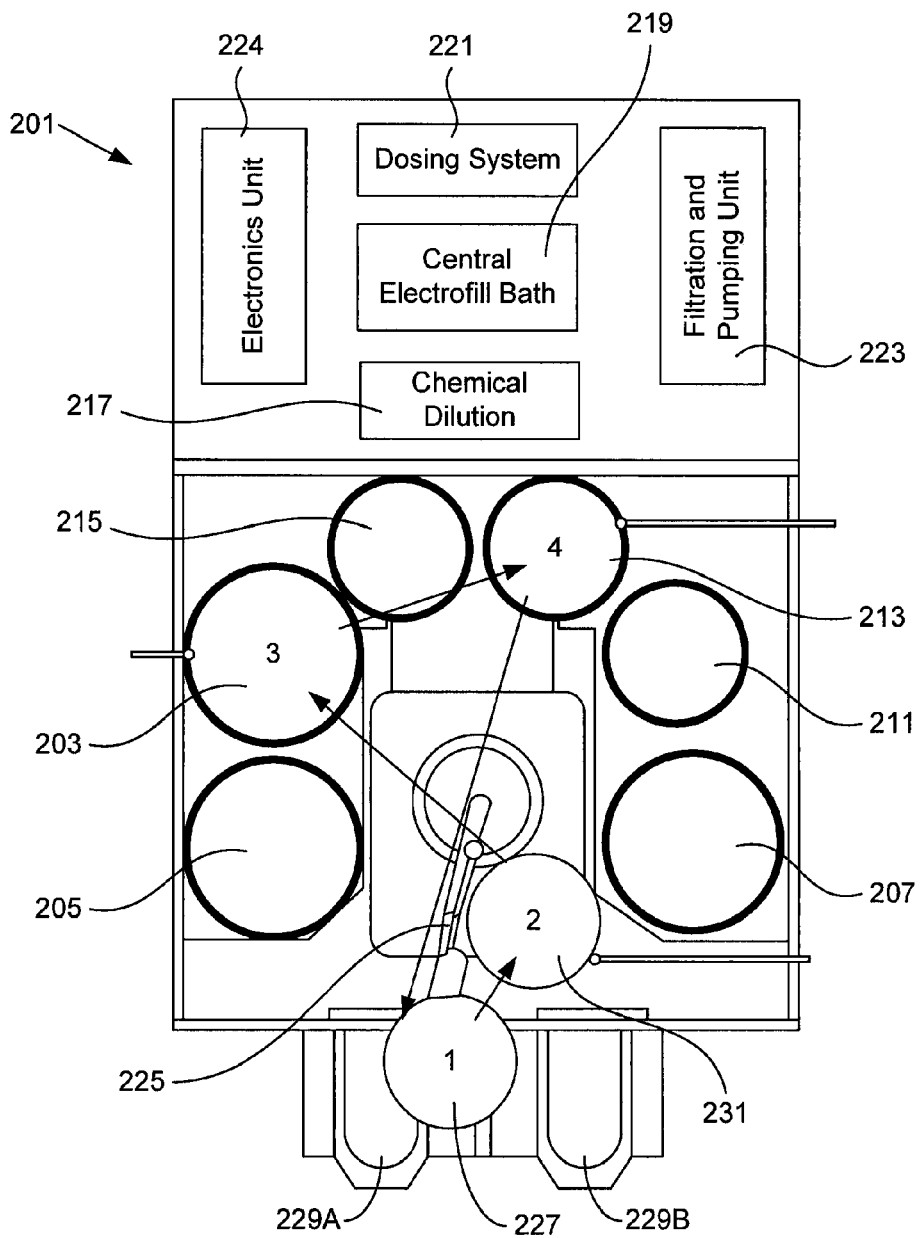
FIG. 2A is a block diagram illustrating an integrated electrofill system including a group of modules used to form copper conductive lines on an integrated circuit.

FIG. 2A depicts an electrofill system 201 in which the invention may reside. The specific system includes three separate electrofill modules 203, 205 and 207. The system 201 also includes three separate post electrofill modules 211, 213 and 215 sometimes referred to as EBR modules. Each of these may be employed to perform each of the following functions: edge bevel removal, backside etching, and acid cleaning of wafers after they have been electrofilled. The system 201 also includes a chemical dilution module 217 and a central electrofill bath 219, which is a tank that holds the chemical solution used as the electroplating bath in the electrofill modules. The system 201 also includes a dosing system 221 that stores and delivers chemical additives for the plating bath. A filtration and pumping unit 223 filters the plating solution for central bath 219 and pumps it to the electrofill modules. Finally, an electronics unit 224 provides the electronic and interface controls required to operate system 201. The electronic unit 224 may also provide a power supply for the system.

In operation, a robot including a robot arm 225 selects wafers such as a wafer 227 from a wafer cassette such as a cassette 229A or a cassette 229B. The robot arm 225 may attach to the wafer 227 using a vacuum attachment and then may align the position of the wafer 227 in an aligner 231. The robot art 225 then delivers the wafer 227 to one of the electrofill modules, such as the electrofill module 203. There, the wafer 227 is electrofilled, for example with copper metal. The electrofill module 203 employs electrolyte from a central bath 219. After the electrofill operation is completed, the robot arm 225 removes the wafer 227 from the electrofill module 203 and transports it to one of the post-electrofill modules, for example the module 213. There unwanted metal is etched away from the edge bevel region and the backside by an etchant solution provided by the chemical dilution module 217. In one embodiment, the aligner 231 is used to reference the wafer 227 prior to edge bevel removal operation. After operation in the post electrofill module 213 is completed, the robot arm 225 retrieves the wafer 227 from the module and returns it to the cassette 229A or 229B.

Figure 2B:
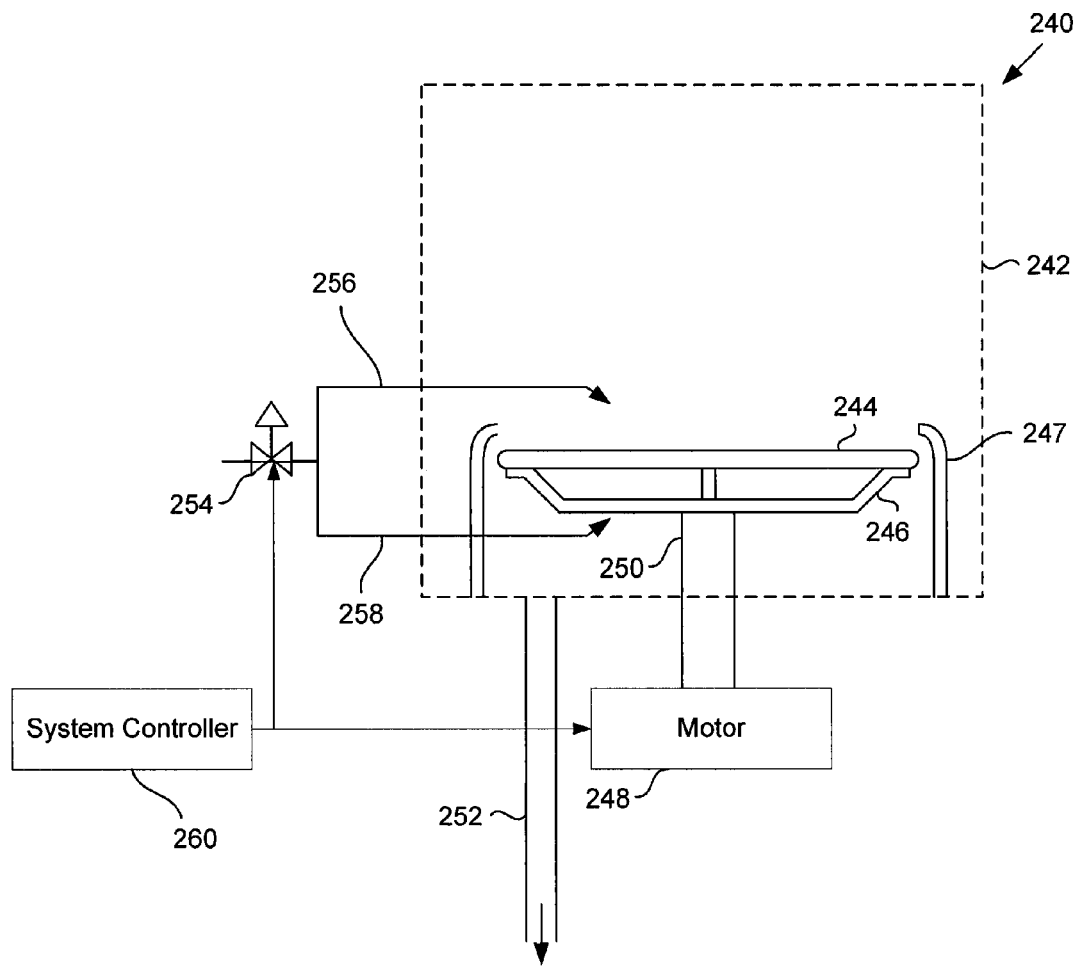
FIG. 2B is a block diagram illustrating various elements of a post-electrofill module in accordance with one embodiment of this invention.

FIG. 2B schematically illustrates a post-electrofill module 240 suitable for use with an electrofill system of this invention. It may serve as a module in electrofill system 201 for example. As shown, the module 240 includes a chamber 242 in which a semiconductor wafer 244 rotates. The wafer chuck 246 may also align the wafer 244 relative to the other components of the module. A deflector shield 247 is positioned with the module 240 around the chuck 246 in such way as to prevent any liquid or debris leaving the wafer 244 during its rotation from hitting the walls of the module 240. The deflector shield 247 may be attached to the side walls or the bottom of the module 242. In one alternative embodiment, the deflector shield 247 may be attached to the wafer chuck 246 and rotate together with the chuck 246. In such embodiment, any liquid or debris leaving the surface of the wafer 244 and making initial contact with the surface of the deflector shield 247 may experience less shear stress and thus would be less likely to bounce back onto the wafer 244. The deflector shield 247 diverts pre-rinse liquid leaving the front side surface of the wafer 224 to the bottom of the chamber 242. The chamber 242 is outfitted with a drain 252. The drain 264 allows the various liquid streams provided to the chamber 242 to be removed for waste treatment.

A motor 248 controls the rotation of the wafer chuck 246 through a shaft 250. The motor 248 should be easy to control and should smoothly transition between various rotational speeds. Any wobble in the shaft 250 on rotation should be small (~<0.05 millimeters for example) so that the location of fluid nozzles with respect to the wafer does not vary substantially, nor shake the wafer from its center while it is not confined by alignment or clamping members. Preferably, the motor 248 can rapidly accelerate and decelerate (in a controlled fashion) the chuck 246 and the wafer 244 at rotation rates between 0 and about 2000 rpm. The motor speed and other operations may be controllable by a system controller 260, which may be included in the electronic unit of the system.

The chuck 246 may be of any suitable design that holds the wafer 244 in position during various rotational speeds. It may also facilitate alignment of the wafer 244 for the etching process. A few particularly preferred examples of wafer chucks are described in U.S. Pat. No. 6,537,416 and U.S. patent application Ser. No. 11/737,045, both incorporated herein by reference for all purposes. The chamber 242 may be of any suitable design that confines the liquid etchant within its interior and allows delivery of the various fluids and gases to the wafer 244. It should be constructed of an etchant resistant material and include ports and nozzles for the various liquid and gaseous streams used during etching and cleaning. For example, an apparatus may include lines for delivering dry $N_2$, Ar, He, $H_2$, $N_2$, IPA, and mixtures of thereof. Any process chemicals, such as deionized water, sulfuric acid, hydrogen peroxide, thinning fluid, and others are supplied into the chamber 242 via a set control valves and mass flow meters 254 and set of front side delivery lines 256 and as set of backside delivery lines. Such lines may be equipped with specific nozzle to distribute leading to the top of the wafer.

In the depicted embodiment, a system controller 260 is employed to control process conditions during pre-rinsing, thinning, etching, washing, drying and other process operations. The controller will typically include one or more memory devices and one or more processors. The processor may include a CPU or computer, analog and/or digital input/output connections, stepper motor controller boards, etc. Instructions for implementing appropriate control operations are executed on the processor. These instructions may be stored on the memory devices associated with the controller or they may be provided over a network.

In certain embodiments, the controller controls all of the activities of the post-electrofill module. The system controller executes system control software including sets of instructions for controlling the timing of the processing steps, chuck rotation speeds, flow rates and temperatures of DI water, acid and etchant and other parameters of a particular process. Other computer programs, scripts or routines stored on memory devices associated with the controller may be employed in some embodiments.

Typically there will be a user interface associated with the controller 274. The user interface may include a display screen, graphical software displays of the apparatus and/or process conditions, and user input devices such as pointing devices, keyboards, touch screens, microphones, etc.

The computer program code for controlling the pre-rinsing, thinning, etching, washing, drying and other process operations can be written in any conventional computer readable programming language: for example, assembly language, C, C++, Pascal, Fortran or others. Compiled object code or script is executed by the processor to perform the tasks identified in the program.

The controller parameters relate to process conditions such as, for example, timing of the processing steps, chuck rotation speeds, flow rates and temperatures of DI water, acid and etchant and other parameters of a particular process. These parameters are provided to the controller in the form of a recipe, and may be entered utilizing the user interface or embedded in the controller or downloaded over a network.

Signals for monitoring the process may be provided by analog and/or digital input connections of the system controller. The signals for controlling the process are output on the analog and digital output connections of the post-electrofill module.

Figure 2C:
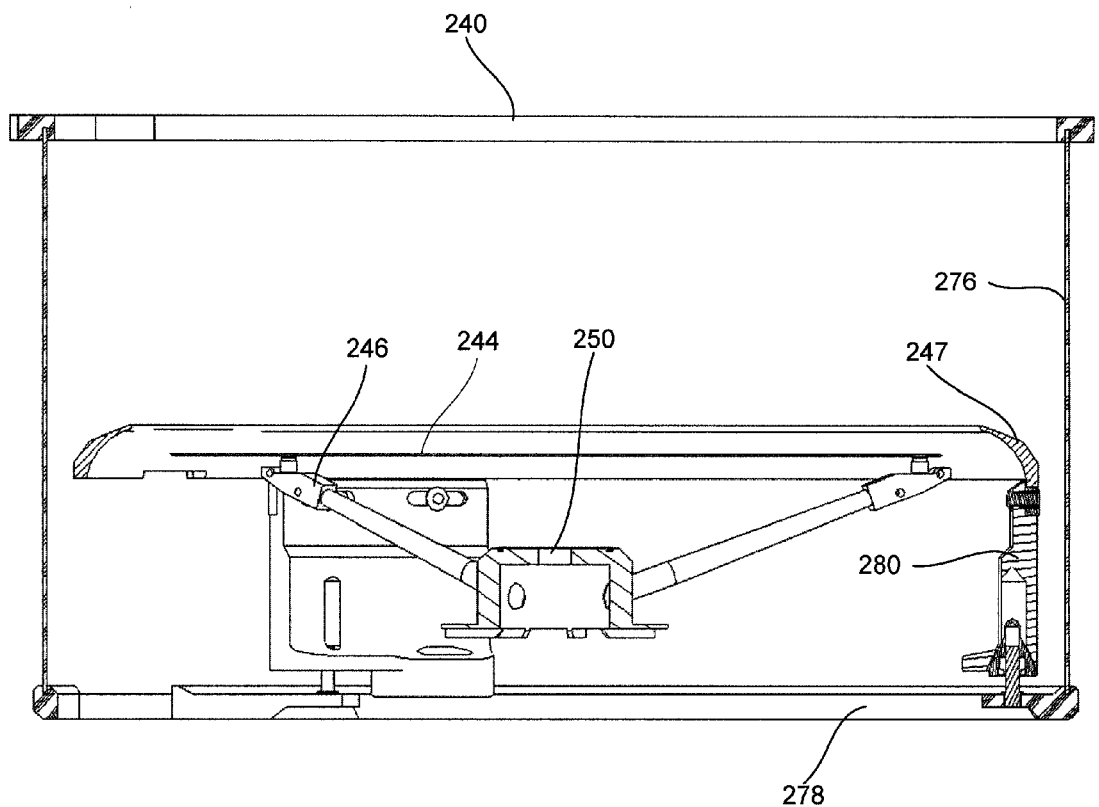
FIG. 2C is cross-sectional view of a post-electrofill module illustrating various elements in accordance with one embodiment of this invention.

FIG. 2C is cross-sectional view of a post-electrofill module 240 illustrating various elements in accordance with one embodiment of this invention. The wafer 244 is supported by the wafer chuck 246 that is further attached to the shaft 250 of the motor (not shown). The deflector shield 247 is positioned in between the side wall 276 of the module 240 and the edge of the wafer 244. The deflector shield 247 may be attached to the bottom 278 of the module 240 using a deflector shield support 280. In another embodiment, the deflector shield 247 may be attached to the side walls 276. In yet another embodiment, the deflector 247 may be attached to the wafer chuck 246. The deflector shield support 280 may allow for the deflector shield 247 to move vertically between upper position (reflected in FIG. 2C) and lower position (not shown). For example, when the wafer 244 is loaded into or removed from the module 240 or during the final drying operation the deflector shield 247 may be lowered. Alternatively, during pre-rinsing, wet film thinning, and etching operations the deflector shield 247 may be raised to prevent liquid from the top of the wafer surface to splash on the side wall 276 of the module 240.

Figure 2D:
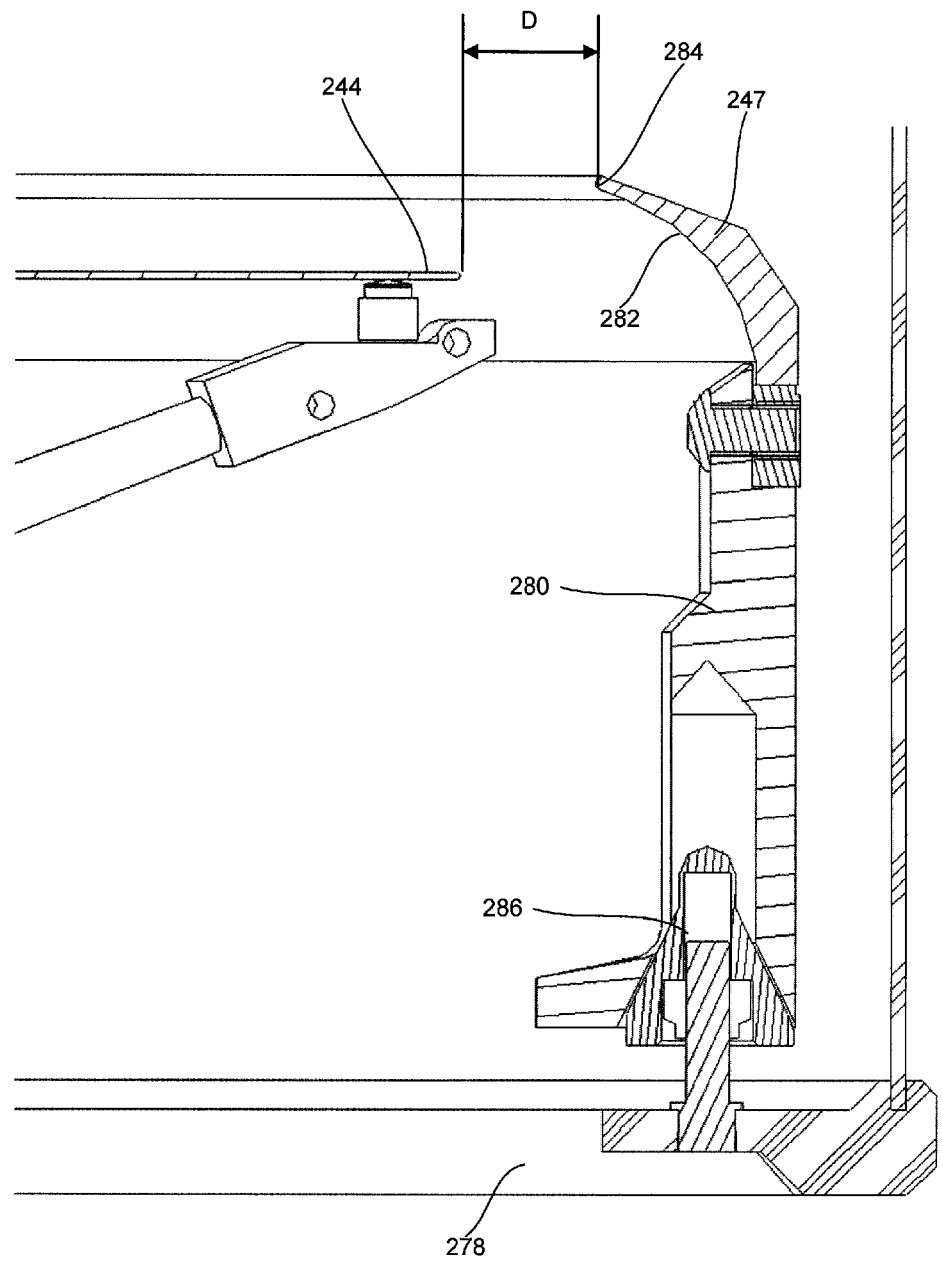
FIG. 2D is a cross-sectional view of a deflector shield and its attachment with the post-electrofill module in accordance with one embodiment of this invention.

FIG. 2D is a cross-sectional view of a deflector shield 247 and the deflector shield support 280 in accordance with one embodiment of this invention. The deflector shield 247 may have a curved surface 282 for capturing liquids flying off the substrate, outwardly away from the wafer in a generally horizontal direction, and directing captured liquids downward, away from the substrate, toward a fluid capture mechanism. Various deflector shields shapes can be used for this purpose, such as one that is directed towards the wafer 244 as shown in FIG. 2D. The curved surface 282 of the depicted shield 247 deflects liquids escaping from the surface of the wafer 244 when it rotates and preventing these liquids from bouncing back onto the surface of the wafer 244. The curved surface 282 may have a circular shape (e.g., a quarter of a circle), a parabolic shape (e.g., a half of a parabola), a straight line shape positioned at an obtuse angle relative to the top surface of the wafer 244, a polygonal shape (multiple straight segments separated by angles), or any other shape that allows deflection of the liquids away from the surface of the wafer 244. The deflector shield 247 may be positioned at certain distance from the edge of the wafer. The distance may allow the deflector shield 247 to move between the lower and upper positions. In one embodiment, the distance (D) between edge of the wafer 244 and an inside edge 284 of the deflector shield 247 may be between about 2 and 50 mm. In one specific embodiment the distance is between about 5-15 mm. The deflector shield 247 may be made out of any suitable material. For example, the deflector shield 247 may be machined out of various metals, such as stainless steel, or plastics, such as Teflon, Polyvinylidene Fluoride (PVDF), Chlorinated polyvinyl chloride (CPVC) and polyvinyl chloride (PVC), epoxy, polypropylene, polyethylene, or any other plastic resistant to etchant chemistries used The deflector shield 247 may be also molded (rather than machined) out of plastic. In one embodiment, the deflector shield 247 may be a combination of two materials. For example, the deflector shield 247 comprise metal for rigidity that is coated with chemically resistant polymer. Overall, any materials suitable for other elements of the post-electrofill module 240 may be used for the deflector shield 247.

The deflector shield 247 may be attached to the bottom 278 of the module using the deflector shield support 280. In one embodiment, the deflector 247 may be attached to the deflector shield support 280 such that the deflector shield 247 may be separated from the deflector shield support 280. For example, the two parts may be attached with a screw assembly, latch, or some other form of mechanical attachment. In another embodiment, the deflector shield 247 and the deflector shield support 280 may be permanently attached. For example, the two parts may be molded into or machined as a single part. The depicted deflector shield support 280 includes a height adjustment mechanism 286. The height adjustment mechanism 286 may have a design which allows raising and lowering of the deflector shield 247 when the mechanism is rotated. For example, rotating the height adjustment mechanism 286 clockwise may raise the deflector shield 247 with respect to the wafer 244. Similarly, rotating the height adjustment mechanism 286 counter clockwise may lower the deflector shield 247 with respect to the wafer 244. In one embodiment, the top of the deflector shield 247 in the raised position is at least 10 mm above the surface of the wafer 244 to capture any liquid being spun from the surface of the wafer.

EBR Process Details

Figure 3:
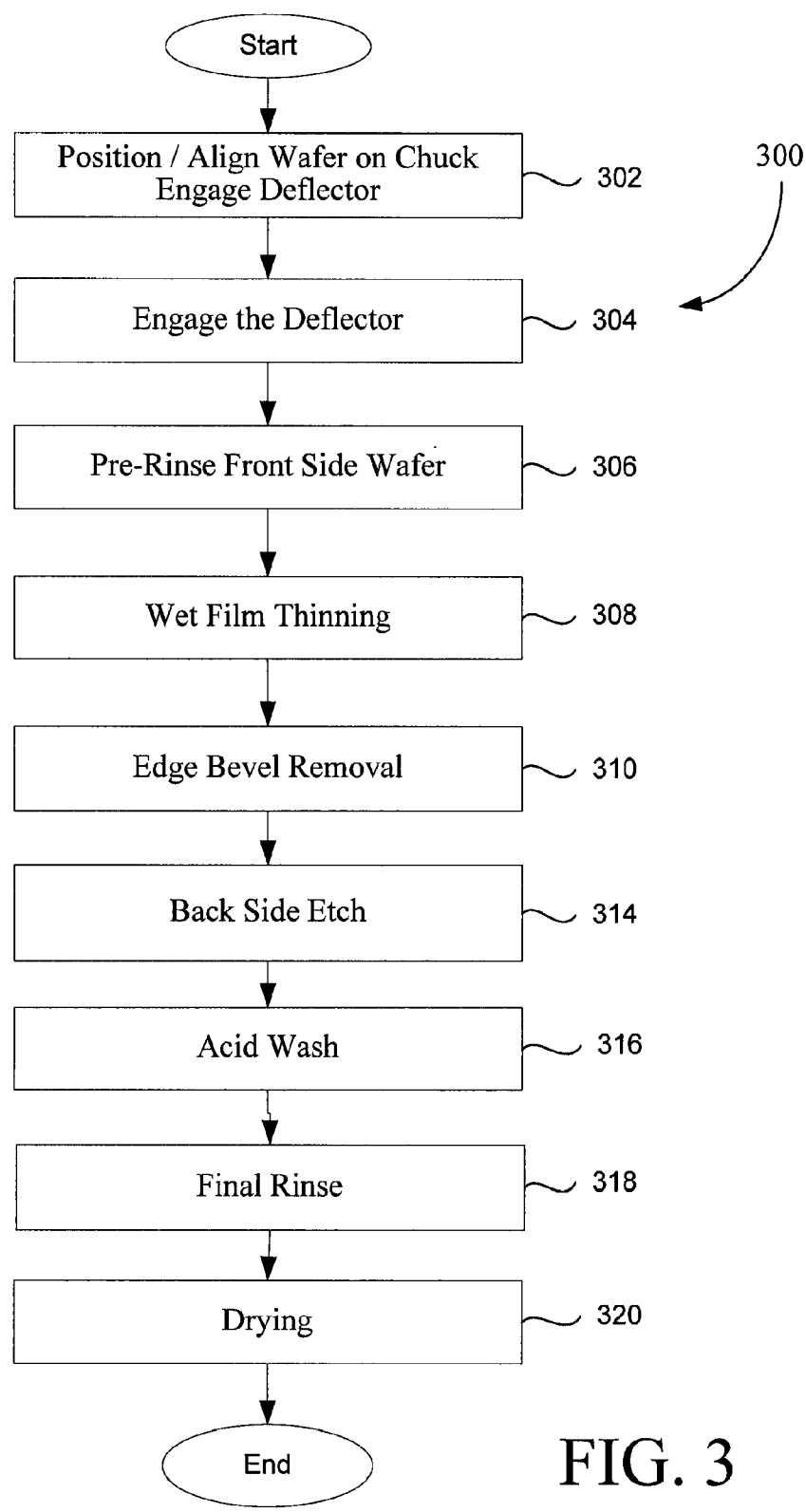
FIG. 3 is a process flow diagram illustrating a typical sequence of operations employed with a post-electrofill module in accordance with an embodiment of this invention.

A specific embodiment of the EBR process is illustrated in FIG. 3. Several details of the EBR process are described in U.S. Pat. Nos. 6,309,981, and 6,586,342, both incorporated herein by reference for all purposes.

The depicted EBR process 300 can be carried out by a post-electrofill module, such as the module 240 of FIG. 2B. The process may start with operation 302 where the robot arm places the wafer into the module chuck on a set of support pins. The wafer is aligned inside the chuck by vertical alignment pins. The support pins hold the wafer in place by static friction when the wafer is rotated. A vacuum chuck can also be used. After placement of the wafer on the pins, the robot arm then retracts.

In one embodiment, a deflector shield is then engaged in an operation 304. As indicated, the deflector shield may be raised from its lowered position into the upper position. In the upper position, the deflector shield may be aligned relative to the wafer in such way that most of the liquid leaving the surface of the wafer is deflected away from the wafer. The deflector shield essentially prevents or reduces back-splashing of liquids back onto the wafer surface during rotation of the wafer in the subsequent operations. In an alternative embodiment, the deflector shield may be constantly kept in one position.

Next, the wafer begins to spin at, e.g., about 150-400 rpm and deionized water is applied to the front of the wafer. See operation 306. Wafer rotation serves to evenly distribute the applied deionized water over the wafer surface and to remove the excess of water from the wafer from surface. This pre-rinsing removes particles and contaminants left over from previous processing steps. Moreover, pre-rinse wets the front side of the wafer that may be dry after the previous processing steps. In one embodiment, the pre-rinse operation employs only deionized water and no acid. The pre-rinse operation takes place anywhere between 1 to 5 seconds with a flow rate of 200-800 ml/minute depending on rinse water temperature, plating chemistry, deionized water flow rate and the rotational speed of the wafer. It is sometime desirable to use hot rinse water to accelerate the pre-rinse efficiency. Therefore, DI water at from 20 to 50° C. can be employed depending on the economics of the operations.

Creating a uniform water film on the wafer surface is frequently desirable. Using a "clamshell" or other wafer clamping tool that excludes the wafer edge during plating often results in parts of wafer edges being dry, while other being wet. An etching process may be ineffective and even damaging to the wafer if etchant is distributed over an unevenly wetted edge.

It has now been found that it may be desirable to have a uniform but thin layer of water in the areas where etchant is applied. A thinner film provides for faster diffusion of the etchant to the metal and smaller taper width on the etched edge of the metal. To produce a thinner film, the deionized water is turned off after pre-rinse operation 306, and the wafer rotational speed is increased substantially (e.g., to about 400-1300 rpm in certain embodiments) for approximately a relatively short duration (e.g., about 1 to 5 seconds in certain embodiments) allowing for wet film thinning. See block 308 in FIG. 3. In a specific embodiment, the wafer is rotated at about 600-1200 rpm for approximately 1.5-3 seconds. These parameters may depend on the wafer size, surface tension of the pre-rinse liquid that may be modified with various surfactants, and other factors. Higher rotation speed leads to greater centrifugal force experienced by the layer of the pre-rinse liquid. This force is directed away from the center of the wafer and therefore removes some of the pre-rinsed liquid from the wafer. Moreover, higher centrifugal forces may provide better uniformity of the layer. Further, the higher rotational speeds of the wet film thinning operation 308 enhance evaporation of the pre-rinse liquid from the surface of the wafer further thinning the layer of the remaining liquid. However, rotation speeds should not exceed levels at which thin water layer looses its uniformity, i.e. breaks apart, or wafer looses its alignment.

The rotation speed may be selected to minimize the overall process time of the EBR 300. It was determined that rotating a 300-mm wafer for about 2 seconds at 800 rpm during the wet film thinning operation 308 shortened EBR operation 310 from approximately 36 seconds to approximately 23 seconds. Moreover, the same thinning operations parameters reduced the pre-rinse operation 306 from about 20 seconds to about 2 seconds. Without being restricted to any particular theory it is believed that the wet film thinning operation may help to overcome surface tension of the pre-rinse liquid on the substrate surface.

In one embodiment, the wet film thinning operation 308 may include delivering of thinning fluid to the edge area or to the entire surface of the wafer. Thinning fluids may reduce the surface tension and increase vapor pressure of the resulting solution. Lowered surface tension changes the contact angle of the layer at the edge bevel area leading to a smaller bead. At the same time, higher vapor pressures increase evaporation. For example, a high vapor pressure organic solvent, like isopropyl alcohol ("IPA"), may be delivered on the top of the pre-rinsed liquid through a nozzle similar to delivering of the etchant during the EBR 310 operation.

In another embodiment, the thinning fluid may be also pre-heated and be applied together with other liquids or carrier gases to further heat the edge liquid and thin down the liquid layer further reducing the surface tension and viscosity. In one embodiment, thinning fluids may be delivered right after the pre-rinse 306 operation and before the wafer is accelerated. In another embodiment, thinning fluids may be applied during or after acceleration of the wafer.

In certain embodiments, the wet film thinning operation 308 may include use of an impinging flowing gas to help physically remove excess fluid from the periphery. In such operation, a directed jet of gas flowing though a nozzle near the wafer periphery imparts momentum and an added force on the liquid bed, forcing entrained fluid outward and away from the bevel and allowing it to be quickly thinned.

In an alternative approach typically requiring a lower velocity and rate of flowing gas, an edge liquid bead thinning technique imparts a liquid-surface-tension-reducing gas stream, typically an organic compound in gas, vapor, or aerosol form, blown through a nozzle onto the surface of the liquid edge bead layer. Molecules of the surface-tension-lowering stream are adsorbed into the liquid layer on the wafer surface. By passing a soluble and surface tension lowering adsorbate over the air-liquid interface, the air-liquid interfacial tension of the fluid adhering to a wafer is reduced, thereby altering the balance of forces between centrifugal and surface tension forces and allowing the bead to be thinned. Suitable surface tension reducing chemicals tend to be volatile, soluble in the water, and have some spatially separated polar and non-polar molecular groups so that, like most surfactants, they can align non-polar groups to the surface and polar groups with the internal regions of the fluid, thereby reducing surface energies and forces. Isopropyl alcohol (IPA) is one typical example of a chemical used in a vapor or an aerosol form to achieve this liquid-layer thinning result. Other examples include other alcohols (ethanol, butanol), amines (ethyl and propylamine), ketones (MEK) and aldehydes (acetylaldehyde) that have hydrophilic and hydrophobic molecular groups. From a different perspective, the thinning liquid may be chosen to significantly increase the vapor pressure of the prerinse liquid. In one embodiment, ultrasonic oscillation operating at 25-120 kHz may be used to create IPA aerosol and aid in the rapid diffusion of gas into the edge bead fluid. Typically, IPA is fed at about 1 ml/min to 100 ml/min at a mole fraction of 2 to 30% in a carrying gas (e.g. nitrogen), depending on the configuration of the nozzle and other process parameters. Other vapors and aerosols may also be used and combination of physical (force of flowing gas) and chemical (reduced surface tension) removal of the bead are also possible.

As indicated, film thinning operation 308 produces a generally uniform thin aqueous layer. The etchant is then delivered, as depicted in an EBR operation 310, on the top of this aqueous layer in the edge areas of the wafer and diffuses through the layer to contact the metal. A thinner pre-rinse layer provide for faster etchant diffusion and less dilution. Moreover, the etchant is localized in the edge area rather than diffusing through the aqueous layer towards the center of the wafer leading to increased taper width.

In the depicted embodiment, the process continues with edge bevel removal (EBR) operation 310. In certain embodiments, the wafer is rotated at about 150-400 rpm, more preferably about 200 to 250 rpm for 200 mm wafers and about 175 to 225 rpm for 300 mm wafers. This rotational speed ensures coverage of the entire edge area with the EBR etchant. The acceleration of the wafer during the wet film thinning operation and deceleration during the EBR operation may be performed at rates that ensure continued alignment of the wafer in the chuck. In certain embodiments, the rotational rate does not exceed about 150 rpm/sec when using typical plastic support pins (e.g. PPS or PVDF). Pins with greater friction coefficient may be used as long as they do not flake or generate particles. Moreover, the wafer may be additionally supported at the center.

The EBR etchant and the edge bead liquid surface tension reducing stream are typically applied to the surface of the wafer using a thin tube with a nozzle opening at or near its end. When dispensing a small amount of etchant onto a surface as such, three flow regimes can generally result, any of which may be appropriate for certain embodiments or applications of the present invention. The first regime is edge beading, where surface tension forces dominate the behavior of the fluid, the second is viscous flow, where viscous forces predominate, and the third is inertial, where inertial forces predominate and the fluid tends to spray. In one embodiment, the EBR operation 310 is performed under the following conditions: a total of about 2 to 14 milliliters etchant is delivered at a rate of about 0.25 to 2 milliliters/second (more preferably about 0.3 to 0.5 milliliters/second). The amount delivered depends on the film thickness to be removed, size of the wafer, the concentration of chemical etchant, rotation rate and etchant temperature.

In another embodiment, the etchant is delivered in several stages. For example, the etchant may be delivered in two stages: a high flow rate stage followed by a lower flow rate stage. During the high flow rates stage the etchant may be delivered at about 0.25-0.35 ml/s for about 1-5 seconds followed by the low flow rate stage with delivery rate of about 0.10-0.20 ml/s for about 10-30 sec. The high flow rate stage helps the EBR etchant overcome the surface tension resistance of the pre-rinse film and rapidly diffuse through the layer. At this stage, diffusion of the etchant within the film is facilitated because the film is originally free from etchant. However, the duration of this stage should not exceed the time required for the etchant to saturate the film. The low flow rate stage then supplies the bulk of the etchant for EBR. The flow rate should be small enough to prevent excessive diffusion of the etchant into the active part of the wafer, which may result in the wider taper. The delivery rate and the duration at this stage may depend on a wafer diameter (length of the edge bevel), bevel thickness, pre-rinse film thickness, and other factors. Excessive etchant may result in wider taper width. In a specific embodiment optimized for up to about 0.75 micrometer thick bevels on a 300-mm wafer, about 2-4 ml of etchant is delivered over a period of approximately 15-20 seconds.

The etchant may include an acid and oxidizer. Examples of acids that are useful include sulfuric acid, hydrohalic acids, chromic acid and nitric acid. In one embodiment, the etchant for copper EBR may be a solution of $H_2SO_4$ (sulfuric acid) and $H_2O_2$ (hydrogen peroxide) in water. In one specific embodiment, the etchant comprises between about 15% to 25% $H_2SO_4$ by weight and 20% to 35% $H_2O_2$ by weight. A thinner film of the pre-rinsed liquid may allow higher acid concentration in the etchant. Other oxidants, such as peroxydisulfate $S_2O_8^{-2}$ and concentrated $HNO_3$ (~30% in water), may be used. Near neutral and alkaline etchants which tend to complex with the dissolved metal can also be employed, such as combinations of glycine or ethylene diamine and hydrogen peroxide at a pH of around 9. Generally, the liquid etchant should have physical properties compatible with the etching system, such as surface tension, contact angle, and viscosity. A few particularly preferred examples of etchants are described in U.S. Pat. No. 6,333,275 and U.S. application Ser. No. 11/888,312, incorporated herein by reference for all purposes.

After the required amount of liquid etchant has been applied to the edge of the wafer, deionized water may be applied to the front side of the wafer as a post-EBR rinse. Deionized water may be applied to the entire wafer as a whole and not just the wafer edge. This application of deionized water will generally continue through the subsequent operations of backside etching and backside rinsing so as to protect the wafer from any extraneous backside etchant spray and damage. While the deionized water is applied, the dispense arm moves the etchant nozzle away from the wafer.

At generally about the same time of the post-EBR-rinse, the backside of the wafer is also pre-rinsed with deionized water in much the same manner that the front side of the wafer was. A wet film thinning operation as described above may be similarly included after the rinsing. The pre-rinse of the backside is followed by a backside etch operation (see operation 314), generally with the same etchant that was used for the EBR. In a specific embodiment, a thin jet (initially 0.02 to 0.04 inches in diameter) of liquid etchant is aimed at the center of the wafer backside. The etchant is preferably delivered from a tubular nozzle having a diameter of about 0.02 to 0.04 inches and a length of at least about 5 times the diameter. This etchant then disperses over the entire backside of the wafer. The purpose of the BSE is to remove any residual copper that was formed on the backside of the wafer during formation of the seed layer of PVD copper or picked up in various handling of the wafer backside during fabrication.

The BSE etchant is typically applied using a spray nozzle. Despite gravity, surface tension and viscous forces between the fluid and the spinning wafer generally keeps the etchant in contact with and flowing across the bottom of the wafer long enough to carry out BSE. Since the chuck arms could interfere with the spraying of etchant on the backside of the wafer, the angle of the spray nozzle may be varied during BSE to ensure thorough application of the etchant. Because the wafer is generally held up by support pins that impinge on the backside of the wafer, if the BSE nozzle is not located inside on the chuck and below the wafer supported area the process is generally carried out at two different speeds to ensure that the etchant flows adequately over the entire surface. For instance, the wafer may be rotated at about 350 rpm during part of the BSE and then rotated at 500-700 rpm for the remainder of the BSE. The portions of the backside blocked by the arms will differ at the two speeds, thus ensuring complete coverage. Overall, the BSE process typically may take about 1-4 seconds and use about 1 to 5 ml of etchant (e.g., the etchant described above). As described below, the BSE may reduce the concentration of copper on the backside to less than about $5 \times 10-10$ atoms per $cm^2$ of substrate. Both sides of the wafer (or at least the backside of the wafer) are then rinsed with deionized water to rinse any liquid etchant, particles and contaminants.

In the depicted embodiment, the BSE operation is followed by an acid wash (see operation 316). The flow of deionized water to the front side ends and about 2 to 4 milliliters of a dilute acid is applied to the front side of the wafer to remove residual metal oxide and remove any remaining discolorations. In one embodiment, sulfuric acid diluted to less that 15% by weight in water may be used. In the same or another embodiment, the dilute acid is applied at a rate of about 2-6 ml/s.

During the final rinse operation 318, deionized water is once again applied to the front or both sides of the wafer to rinse the acid from the wafer. In a specific embodiment, the deionized water is applied for about 5-15 seconds at the flow rates of about 400-1000 ml/min. The wafer is rotated at about 1000-2000 rpm, preferably at about 1200-1500 rpm, during this operation. High flow rates and high rotational speeds create a "pressure wash" effects and improve removing any residual acid and particulates from the wafer surface. High rotational speeds enhance surface sheer forces when the slow water stream contacts the wafer surface and is rapidly accelerated in an azimuthal direction. This embodiment is particular helpful when deionized water is supplied close to the center of the wafer where the linear speed of the wafer is the smallest. In one embodiment of this invention, the deflector shield is engaged around the perimeter of the wafer during the final rise operation 318. A high rotational speed provides for more rapid draining of the deionized water from the surface of the wafer. The deflector shield diverts the drained water away from the side walls of the module and prevents the back-splashing onto the surface of the wafer.

The overall EBR process continues with a wafer drying operation 320, where all of the fluid is removed from the front and back of the wafer. The metal front side of the wafer is generally hydrophilic. Depending on the coating on the backside of the wafer, it may be hydrophobic, for example when treated with a fluoropolymer coating, neither hydrophilic or hydrophobic ($SiO_2$), or hydrophilic (SiN). In one embodiment, the wafer is dried by rotating it at about 750-2000 rpm for about 10 to 60 seconds. Generally, wafers must be clamped when rotational speeds exceed 750 rpm. In a specific embodiment, the drying operation occurs on the metallic hydrophilic surface occur in a series of stages. First, the bulk of fluid is removed by spinning the wafer establishing a thin layer of liquid, which is later removed by evaporation. After about 2-4 seconds, a second stage is reached where a force balanced equilibrium between centrifugal and surface tension forces occurs, and a thin layer of liquid which is resistant to further flow is formed. This liquid layer can be very thin, (only a few microns or less, depending on rotation speed) but can only be removed by evaporation the liquid into the flowing gas above. This may take between 10 to 60 seconds.

To increase the speed of wafer drying, one may add approximately 0.1 ml to 1 ml of a surface tension reducing fluid similar to the ones described above to reduce the thickness of the layer and expedite the subsequent evaporative drying. For example, dispensing 0.2 ml of IPA onto the wafer after the rotation rate of 750 rpm is achieved can reduce drying time by more than a half. Alternatively, introducing a small amount of surface tension reducing chemical into the flowing air stream during wafer rotation draws the chemical downward and across the wafer surface, allowing it to be adsorbed into the water layer, reducing the liquid surface tension, and allowing more fluid to flow mechanically outward. This shift in the balance of forces create a much thinner layer of water that needs to be evaporated and also results in a 2 to 3× reduction in the required drying times. Finally the rate of drying of the reduced thickness layer can be increased by heating the surface using a heating lamp. The rate of drying can be enhanced by tuning the lamps output to the natural absorption frequency of water. (For e.g., IR lamp). After this operation, a robot arm removes the wafer from the module and puts it in a cassette.

Figure 4:
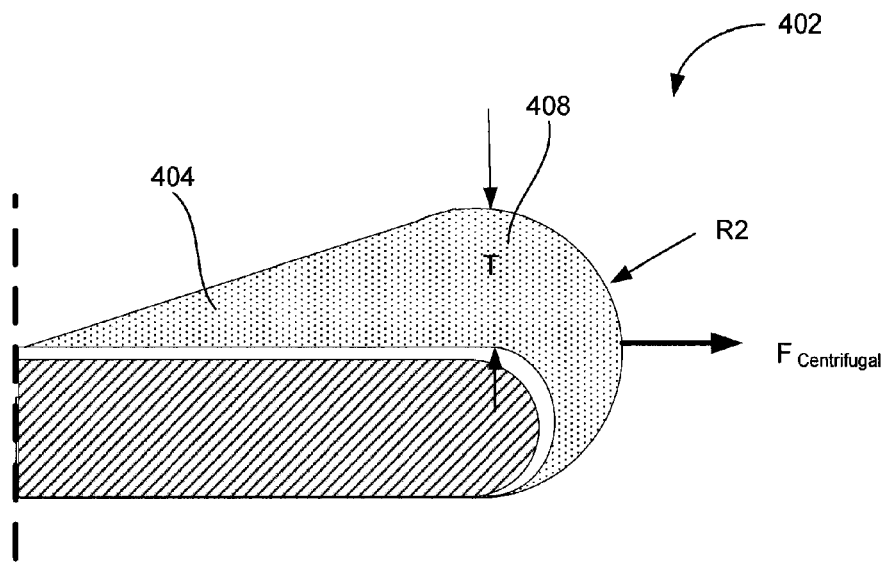
FIG. 4 is a schematic illustration of prerinse liquid at the edge of the wafer at various rotational speeds.
Figure 4:
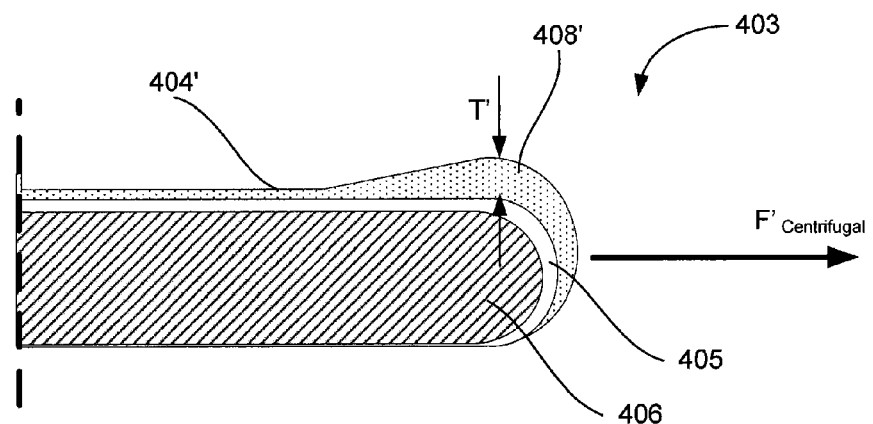

Surface tension is surface property of a liquid that causes it to behave as an elastic sheet and results from intermolecular forces that may dependent on temperature and solutes present. The force balance of surfaces tensions of all liquid interfaces and other forces acting on the liquid, such as gravitational and centrifugal forces, cause a liquid bead formed and a certain contact angle. FIG. 4 shows a schematic view of a wafer edges 402 during a typical pre-rinse operation on a semiconductor wafer 406 with a metal layer 405 formed during the seed layer and electroplating operations. A prerinse liquid layer 404 is formed on the top of the metal layer 405 during the pre-rinse operation. The pre-rinse liquid layer 404 forms a bead 408 at the edge of the wafer. The critical thickness of the pre-rinse liquid layer 404 is right at the edge of the wafer. The etchant during the EBR operation penetrates through the pre-rinse liquid 404 to the bevel edge of the metal layer 405 in order to etch the bevel away. However, the pre-rinse liquid forms a bead 408 resulting in thicker (T) layer above the bevel edge. The etchant therefore diffuses through a longer path (T) and is more likely to diffuse towards the center of the wafer, where the etching is not desirable.

FIG. 4 also illustrates the cross-sectional profile 403 of the wafer 406 with deposited metal 406 and the pre-rinse liquid layer 404' at the end or after the wet thin filming operation. During the wet-thin filming the wafer is spun at high rotational speed, which typically significantly exceeds the one used during the pre-rinse operation. The centrifugal force is proportional to square of the rotation speed and radius of the wafer ($Fc=m\omega^2 r$). For example, increasing the wafer rotation from 400 rpm during the pre-rinse operation to 800 rpm during the wet film thinning operation results in four-fold increase in the centrifugal force experiencing by the pre-rinse layer. The increase centrifugal force initially exceeds the surface tension of the initial liquid layer 404 and the bead 408 and the pre-rinsed liquid is displaced from the surface. The process continues until the increase centrifugal force is balance by the overall surface tension associated with the thinner liquid layer 404' and the smaller bead 408'. After the wet film thinning operation, the etchant has to penetrate through the much thinner (T') liquid of layer associated with the smaller bead 408'.

Figure 5:
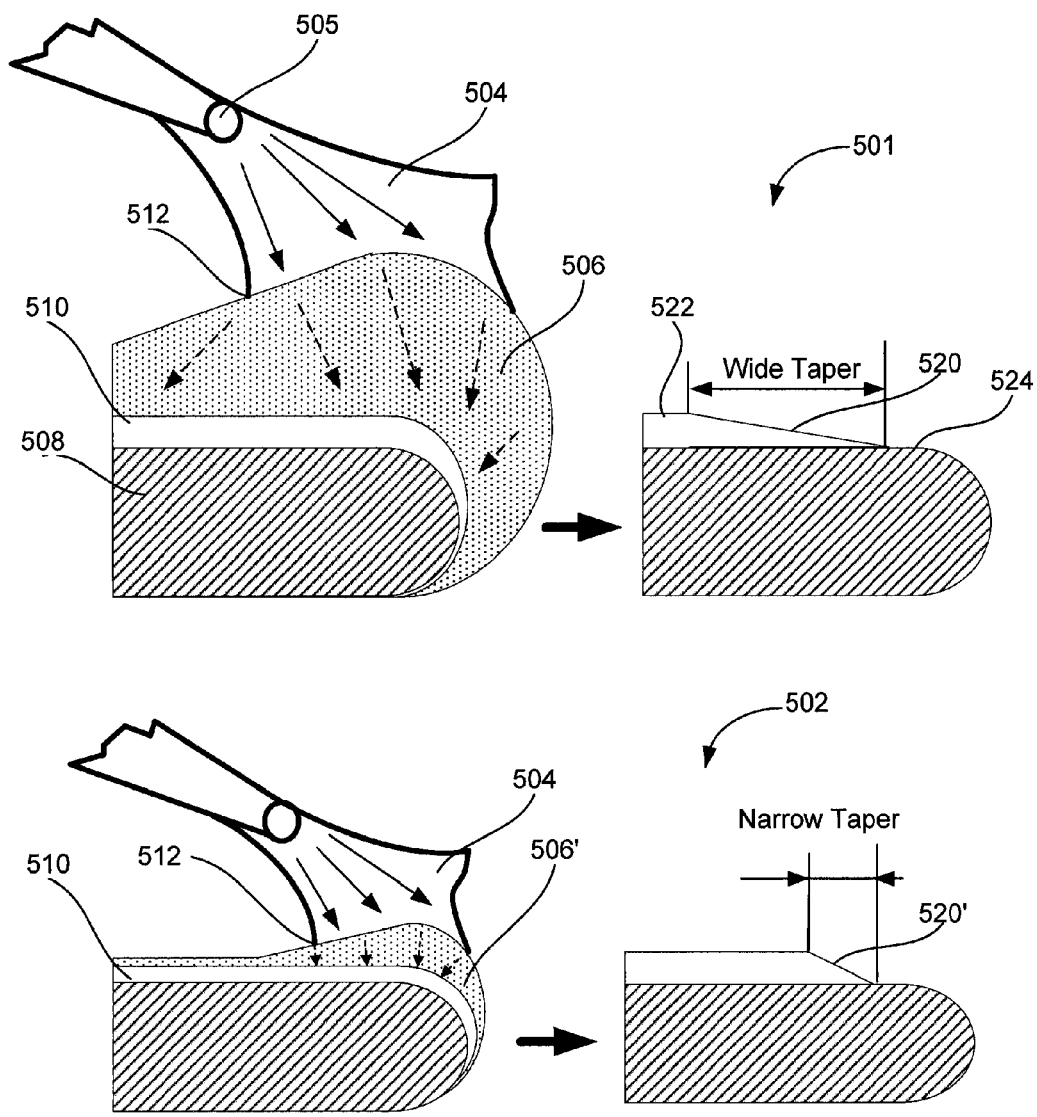
FIG. 5 is a schematic illustration of the etchant being illustration of etchant being delivered to a wafer edge bevel via an etchant dispensing nozzle over prerinse liquid films of two different thicknesses and the effect of the film thickness and etchant diffusion within the film on the taper width.

FIG. 5 schematically illustrates a profile 501 of the etchant 504 delivered over the pre-rinse liquid layer 506 resulting after the standard pre-rinse operation. The etchant nozzle 505 is specifically positioned so that the etchant 504 only impacts the edge of the wafer 508, more specifically the bevel edge area of the deposited metal 510. Based on this position the etchant 504 is distributed only over some region of the pre-rinse liquid layer 506. The surface may be defined by the cut-off line 512, which is illustrated as a point in the schematic 501. The cut off-line 512 represents the extent of the etchant 506 flow towards the center of the wafer 508 before it mixes with and diffuses through the pre-rinse liquid layer 506.

Once the etchant 506 is delivered over the pre-rinsed liquid layer 506, it begins to diffuse through the layer 506 before the etchant is consumed in the etching reaction with the deposited metal 510. The diffusion is driven by the concentration gradient, and the etchant diffuses within the pre-rinse liquid layer 506 in all directions away from its interface with the layer. Notably, the etchant diffuses away from the cut-off line 512 and into the direction towards the center of the wafer (to the left as indicated in FIG. 5). The pre-rinsed liquid layer 506 that has substantial thickness between the cut-off line 512 and the deposited metal 510 surface provides a long diffusion path that allows substantial amount of etchant to also diffuse towards the center of the wafer (to the left of the cut-off line 512 as illustrated in FIG. 5) As a result of this diffusion, the deposited metal 510 will be etched over a relatively wide area and result in a relatively wide taper 520. The taper width is generically defined as the transition from a boundary of full metallization thickness 520 (e.g., the inner or active area of the wafer with 95% metal thickness) to a boundary of no metal 524 (e.g., the edge exclusion area). A narrow taper is highly desirable as it provides for more useful surface of the wafer. In the region with full metallization 520 there was insufficient amount of the diffused etchant to cause any substantially etching. On the other hand, in the region without metal 524 enough etchant diffused to the surface of the deposited metal 510 to etch the entire metal layer.

FIG. 5 also illustrates a schematic profile 502 of the etchant 504 delivered over the pre-rinse liquid layer 506' resulting after the wet film thinning operation. As it was already described in the context of FIG. 4, the pre-rinse liquid layer 506' becomes thinner and more uniform after the wafer is spun at higher rotational speeds. In particular, the size of the liquid bid and thickness of the pre-rinse liquid layer 506' between the cut-off line 512 and the deposited metal 510 may be smaller. As a result, the etchant 504 has to diffusive through the thinner layer and less etchant will diffuse in the direction towards the center of the wafer (to the left of the cut-off line 512 as illustrated in FIG. 5). The etchant will be concentrated over the narrowed area under the cut-off line 512 than compared to the schematic 501. The resulting taper 520' may be much narrower as a result. Moreover, thinning the pre-rinse liquid layer may allow to shorted the overall etching time and the amount of etchant delivered. These factors may also facilitate focusing the concentration of the etchant in the target area and narrow the taper.

Example

The following example is provided to further illustrate aspects and advantages of the present invention. This example is provided to exemplify and more clearly illustrate aspects of the present invention and is in no way intended to be limiting.

A standard 300-mm wafer with a 0.5 µm copper bevel edge was provided. The wafer was positioned and aligned in a Novellus Sabre™ system equipped with the deflector shiled. The pre-rinse operation was performed using de-ionized water for 2 seconds at 400 rpm. The water was then turned of, and the wafer was accelerated to 600 rpm for another 2 seconds during the wet film thinning operation. In the following operation, the wafer was slowed down to 200 rpm and the etchant including 20% of sulfuric acid and 28% of hydrogen peroxide was applied in two stages. In the first stage, 1 ml of the etchant was delivered at 0.3 ml/sec flow rate. In the second stage, additional 3 ml of the etchant was delivered at 0.15 ml/sec. The overall etching process took approximately 23 seconds. The back side etching was then performed in the same way staring with the pre-rinse operation followed by the wet-film thinning and the etching operations. The front side was then washed with an acid solution containing less than 15% of sulfuric acid in deionized water. About 5 ml of the acid solution was applied at 4 ml/sec flow rate through the entire front side of the wafer while the wafer continued to rotate at approximately 200 rpm. The acid solution was turned off and the wafer was accelerated to approximately 1300 rpm. Deionized water was delivered to both sides of the wafer at 800 ml/min for about 10 seconds. The water was then turned off, and the wafer was accelerated to approximately 1500 rpm rotated at this speed for about 30 seconds for drying. The wafer was then stopped and removed from the apparatus. The resulting taper width was estimated to be about 127 µm. The overall process was shortened by about 30 seconds in comparison to a traditional EBR process.

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein. All references cited herein are incorporated by reference for all purposes.

What is claimed is:

1. An apparatus for removing unwanted metal deposited on an edge bevel area of a semiconductor wafer, the apparatus comprising:
 a process chamber;
 a wafer chuck for supporting and rotating the wafer during removal of the unwanted metal from the edge bevel area;
 a nozzle for delivering a prerinse liquid to the wafer;
 a nozzle for delivering a liquid etchant to the wafer; and
 a controller comprising:
  program instructions for rotating the wafer;
  program instructions for prerinsing the wafer using the prerinse liquid;
  program instructions for thinning a layer of the prerinse liquid through increasing the rotational speed of the wafer without drying the wafer; and
  program instructions for delivering a stream of liquid etchant into the thinned layer of prerinse liquid near the edge bevel area of the rotating wafer.

2. The apparatus of claim 1, further comprising a deflector shield positioned around the wafer chuck and configured to deflect the prerinse liquid away from the surface of the wafer.

3. The apparatus of claim 2, wherein the prerinse liquid is deflected downward toward the bottom of the process chamber.

4. The apparatus of claim 3, wherein the deflector shield is attached to the bottom of the process chamber.

5. The apparatus of claim 3, wherein the deflector shield is attached to the wafer chuck and rotates together with the wafer chuck.

6. The apparatus of claim 1, wherein the program instructions for increasing the rotational speed of the wafer include instructions for rotating the wafer at a rotational speed of at least about 600 rpm.

7. The apparatus of claim 6, wherein the program instructions for increasing the rotational speed of the wafer comprise instructions for rotating the wafer at a rotational speed of at least about 900 rpm.

8. The apparatus of claim 1, wherein the program instructions for prerinsing the wafer specify prerinsing for less than about 10 seconds.

9. The apparatus of claim 8, wherein the program instructions for prerinsing the wafer specify prerinsing for less than about 5 seconds.

10. The apparatus of claim 1, wherein the program instructions for delivering a stream of liquid etchant specify delivering the stream for less than about 30 seconds.

11. The apparatus of claim 10, wherein the program instructions for delivering a stream of liquid etchant specify delivering the stream for less than about 25 seconds.

12. The apparatus of claim 1, wherein the controller further comprises program instructions for rinsing at least some of the liquid etchant from the wafer.

13. The apparatus of claim 12, wherein the program instructions for rinsing include instructions for rotating the wafer at a rotational speed of at least about 600 rpm.

14. The apparatus of claim 13, wherein the program instructions for rinsing include instructions for rotating the wafer at a rotational speed of at least about 900 rpm.

15. The apparatus of claim 1, wherein the program instructions for delivering a stream of liquid etchant include:
 instructions for delivering a first stream of liquid etchant at a first flow rate and for a first duration; and
 instructions for delivering a second stream of liquid etchant, after the first stream, at a second flow rate and for a second duration, the second flow rate being substantially less than the first flow rate, and the second duration being substantially longer than the first duration.

16. The apparatus of claim 15, wherein:
 the first flow rate is between about 0.25 and 0.35 ml/sec; and
 the second flow rate is between about 0.10 and 0.20 ml/sec.

17. The apparatus of claim 16, wherein:
 the first duration is between about 1 and 5 seconds; and
 the second duration is between about 10 and 30 seconds.

18. An apparatus for removing unwanted metal deposited on an edge bevel area of a semiconductor wafer, the apparatus comprising:
 a process chamber;
 a wafer chuck for supporting and rotating the wafer during removal of the unwanted metal from the edge bevel area;
 a nozzle for delivering a prerinse liquid to the wafer;

a nozzle for delivering a thinning liquid to the wafer;
a nozzle for delivering a liquid etchant to the wafer and
a controller comprising:
  program instructions for rotating the wafer;
  program instructions for prerinsing the wafer using the prerinse liquid;
  program instructions for thinning layer of the prerinse liquid by delivering a stream of the thinning liquid into the layer of the prerinse liquid near the edge bevel area of the rotating wafer without drying the wafer; and
  program instructions for delivering a stream of liquid etchant into the thinned layer of prerinse liquid near the edge bevel area of the rotating wafer.

19. The apparatus of claim 18, wherein the thinning liquid comprises a liquid selected from the group consisting of isopropyl alcohol, acetone, and a solution of water with a surfactant.

20. The apparatus of claim 18, wherein program instructions for thinning a layer of the prerinse liquid comprise instructions for delivering a stream of heated thinning liquid into the layer of the prerinse liquid near the edge bevel area of the rotating wafer without drying the wafer.

21. An apparatus for removing unwanted metal deposited on an edge bevel area of a semiconductor wafer, the apparatus comprising:
  a process chamber;
  a wafer chuck for supporting and rotating the wafer during removal of the unwanted metal from the edge bevel area;
  a nozzle for delivering a prerinse liquid to the wafer;
  a nozzle for delivering a vapor or aerosol of a thinning liquid to the wafer;
  a nozzle for delivering a liquid etchant to the wafer; and
  a controller comprising:
    program instructions for rotating the wafer;
    program instructions for prerinsing the wafer using the prerinse liquid;
    program instructions for thinning a layer of the prerinse liquid by delivering the vapor or aerosol of the thinning agent over the layer of the prerinse liquid near the edge bevel area of the rotating wafer without drying the wafer; and
    program instructions for delivering a stream of liquid etchant into the thinned layer of prerinse liquid near the edge bevel area of the rotating wafer.

22. An apparatus for removing unwanted metal deposited on an edge bevel area of a semiconductor wafer, the apparatus comprising:
  a process chamber;
  a wafer chuck for supporting and rotating the wafer during removal of the edge bevel area;
  a nozzle for delivering a prerinse liquid to the wafer;
  a nozzle for delivering a liquid etchant to the wafer;
  a radiative heater; and
  a controller comprising:
    program instructions for rotating the wafer;
    program instructions for prerinsing the wafer using the prerinse liquid;
    program instructions for thinning a layer of the prerinse liquid by heating the layer of the prerinse liquid using radiative heat without drying the wafer; and
    program instructions for delivering a stream of liquid etchant into the thinned layer of prerinse liquid near the edge bevel area of the rotating wafer.

* * * * *